United States Patent [19]

Mansur et al.

[11] Patent Number: 5,130,161
[45] Date of Patent: Jul. 14, 1992

[54] PROCESS FOR HARDENING THE SURFACE OF POLYMERS

[76] Inventors: Louis K. Mansur, 105 Timbercrest Dr., Clinton, Tenn. 37716; Eal H. Lee, 189 Outer Dr., Oak Ridge, Tenn. 37830

[21] Appl. No.: 674,840

[22] Filed: Mar. 25, 1991

Related U.S. Application Data

[63] Continuation of Ser. No. 508,148, Apr. 12, 1990, abandoned.

[51] Int. Cl.$^5$ .............................................. B05D 3/06
[52] U.S. Cl. ........................................ 427/38; 427/44
[58] Field of Search .................................. 427/38, 44

[56] References Cited

U.S. PATENT DOCUMENTS

| | | |
|---|---|---|
| 4,377,437 | 3/1983 | Taylor et al. |
| 4,410,611 | 10/1983 | MacIver |
| 4,452,827 | 6/1984 | Kolev et al. |
| 4,526,832 | 7/1985 | Bernett et al. |
| 4,554,208 | 11/1985 | MacIver et al. |
| 4,559,901 | 12/1985 | Morimoto et al. |
| 4,564,830 | 1/1986 | Maeguchi |
| 4,670,064 | 6/1987 | Schachameyer |
| 4,743,493 | 5/1988 | Sioshansi et al. |
| 4,751,100 | 6/1988 | Ogawa |
| 4,886,681 | 12/1989 | Clabes et al. ............... 427/38 |

OTHER PUBLICATIONS

J. D. Destefani, Asst. Ed., "Ion Implantation Update", Advanced Mat. & Processes inc. Metal Progress Oct. 1988, pp. 39-43.

T. Venkatesan, "High Energy Ion Beam Modification of Polymer Films", Nucl. Inst. & Methods in Phys. Res. B7/8 (1985) 461-467.

J. K. Hirvonen, "Surface Modification of Polyemrs and Ceramics", Advanced Materials & Processes, May 1986, 33-36.

M. B. Lewis, et al, "Triple Ion Beam Irradiation Facility", Nucl. Instruments and Methods in Physics Research B43 (1989) 243-253.

*Primary Examiner*—Bernard Pianalto

[57] ABSTRACT

Hard surfaced polymers and the method for making them is generally described. Polymers are subjected to simultaneous multiple ion beam bombardment, that results in a hardening of the surface and improved wear resistance.

23 Claims, 1 Drawing Sheet

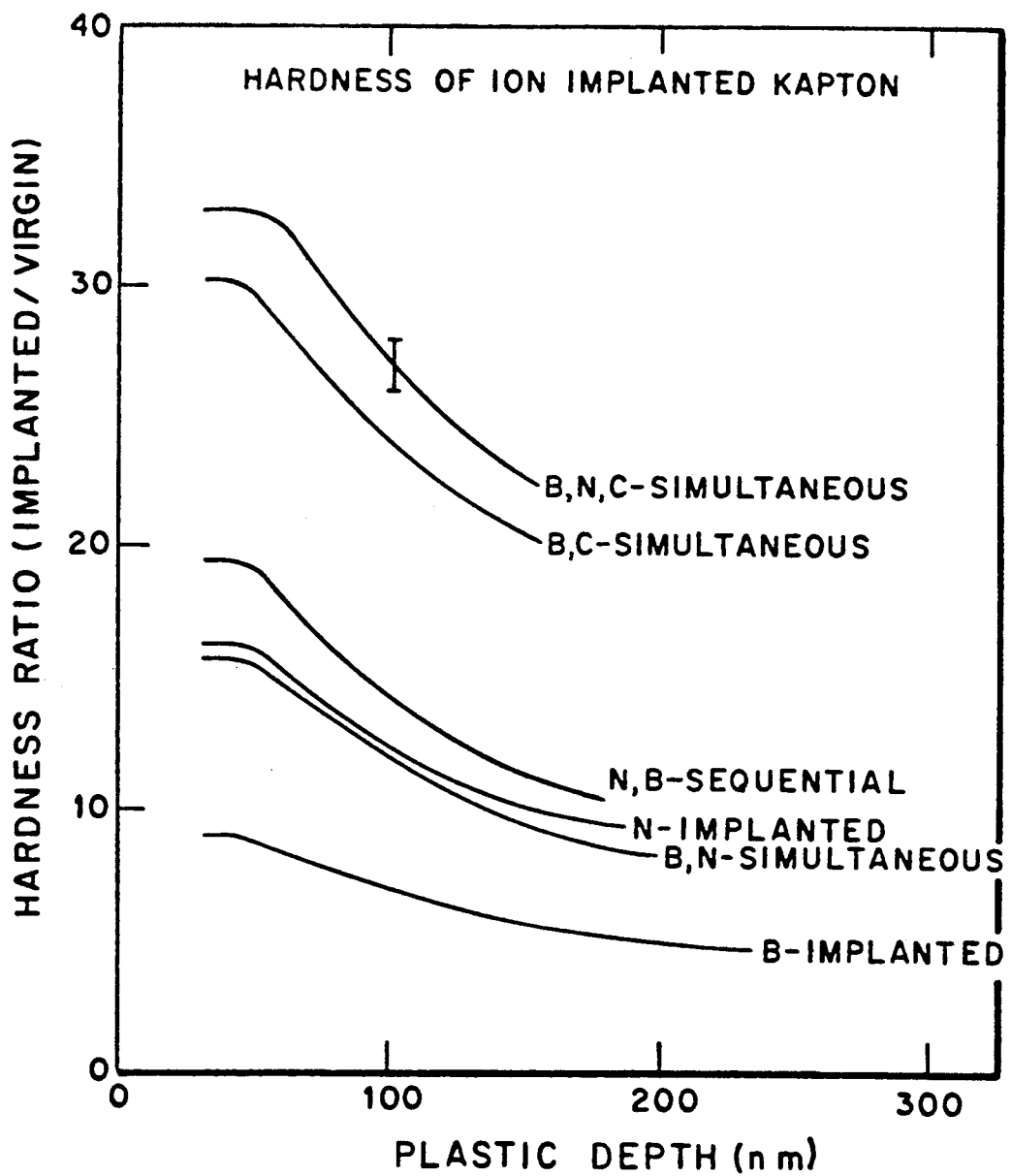

PROCESS FOR HARDENING THE SURFACE OF POLYMERS

The United States Government has rights in this invention pursuant to contract no. DE-AC05-84OR21400 between the United States Department of Energy and Martin Marietta Energy Systems, Inc.

CROSS-REFERENCE TO RELATED APPLICATIONS

This application is a continuation of co-pending application Ser. No. 07/508,148 filed Apr. 12, 1990, now abandoned.

FIELD OF THE INVENTION

This invention relates to polymers having hard surfaces and particularly to polymers that have been subjected to multiple ion beam bombardment to improve mechanical properties at their surface. The invention was developed pursuant to a contract with the United States Department of Energy.

BACKGROUND OF THE INVENTION

Polymers, compositions comprising large organic molecules made from smaller molecules that are linked and cross-linked like chains and nets, are relatively new, having been synthetically produced and commercially developed within the past fifty years. Their many advantages include light weight, moldability, ease of forming into intricate configurations, corrosion resistance, versatile electrical properties and low manufacturing cost. These advantages make them suitable for many every day uses such as in our automobiles and kitchens as well as in high-technology industrial and engineering applications. However, inherent softness and tendency to wear away after prolonged use have made polymers impractical materials when hardness and durability are needed.

Attempts have been made to improve the surface characteristics of polymers by use of ion implantation, ion beam irradiation, high performance organic coatings and thin inorganic oxide coatings. Although these treatments have made some polymers more useful, there is a continuing need to develop polymers having hard surfaces that are resistant to wear.

SUMMARY OF THE INVENTION

In view of the above needs, it is an object of this invention to provide a polymer having a hardened surface.

It is another object of this invention to provide a polymer that can be used in abrasive environments for a long period of time.

A further object of this invention is to provide a polymer having added linking elements at the surface.

Another object of the invention is to provide a polymer having artificially introduced alloying elements at the surface.

It is another object of this invention to provide a polymer having hard particle formation at the surface comprising added elements.

An additional object of the invention is to provide a process for making a polymer having a hard surface that will withstand wear under harsh conditions for a prolonged period of time.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the composition of this invention may comprise a polymer that has embedded within its surface hard compounds [particulate formations] that are formed when alloying elements are introduced by ion beam bombardment and react with either the elements of the polymer or with each other. These alloying elements may also increase hardness by causing the chemical crosslinking of the polymer during bombardment. The invention may also comprise a process for making hard surface polymers comprising bombarding the surface of a polymer with multiple ions of elements that when reacted with the elements of the polymer will form a compound [particulate formation] that is hard. The composition has improved hardness and wear resistance at the surface that broadens the scope of applications of these materials.

BRIEF DESCRIPTION OF THE DRAWINGS

The Figure shows hardness test results of implanted and unimplanted Kapton polyimide as a function of depth.

DETAILED DESCRIPTION OF THE PREFERRED EMBODIMENT

Ion beam modification of materials has been the subject of intensive research in many laboratories. Most of the work has involved doping in semiconductors or improving metals and ceramics, while much less attention has been paid to organic molecular solids and polymeric materials. Studies of ion implantation of these materials relate primarily to changes in electrical or optical properties with less emphasis on physical or chemical properties. Studies of mechanical property changes have even been more neglected, despite the fact that the utilization of polymers could be expanded greatly if significant improvement could be made in surface mechanical properties.

The composition of this invention employs ion beam implantation of polymers to harden the surface. Various elements were used as the ion beam source and various polymers were used as the surface. It was found that polymer surfaces were generally hardened by ion beam bombardment and that bombardment by multiple ion beams exhibited significant improvements over single beam implantation.

In conventional studies of ion beam bombardment chemical cross-linking was thought to be the main hardening mechanism. This application discloses two new mechanisms that operate when a polymer surface is bombarded with multiple beams simultaneously; first, the addition of a bond-forming element and, second, hard particle formation.

It is believed that any polymer will exhibit surface hardening when subjected to this process. A prefered polymer is one that does not soften upon ion emplantation, such as a high temperature polymer. Examples of polymers are Kapton, the tradename for polypyromellitimide polyimide, Teflon, the tradename for flourinated ethylene/perfluoroalkyl vinyl ether copolymer, Tefzel, the tradename for tetrafluoroethylene/ethylene copolymer, and PET the tradename for polyethylene terephthalate, all sold by the DuPont Company of Wilmington, Del. Other examples are PEEK, the tradename for poly(ether-ether-ketone) manufactured by Westlake Plastic Company of Lenni, Pa. and Lexan, the trade name for polycarbonate manufactured by General Electric Company of Pittsfield, Mass.

The elements selected for the ion source are broadly those that will form hard compounds with elements of the polymer or with other bombarding elements. For instance silicon, zirconium and tungsten are good ion sources since they form hard compounds with carbon, the primary element of the polymer composite. Nitrogen is also good since it forms hard compounds with elements such as boron and carbon. If these ions are bombarded simultaneously at a surface then the added hardening mechanism of particulate formation operates to improve the mechanical properties of the surface beyond that which is possible when the bombardment is successive. Other ions that will cause a hardening effect are those that react to form carbides, silicides, oxides and nitrides, provided they are bombarded simultaneously with carbon, silicon, oxygen and nitrogen, respectively.

Other elements that have a hardening effect are those that allow additional crosslinking of the polymer. These are generally those elements that are multivalent, thus having multiple bonding sites available additional linkages to form. Examples are Fe, B, Cr, V, Ti, Hf and S. Of those, V, Ti and Hf are also carbide forming, therefore they possess two hardening mechanisms.

The composition and process described is intended to be illustrative and not in any way a limitation on the scope of the invention. Persons of ordinary skill in the art should be able to envision variations on the general principle of this invention that fall within the scope of the claims.

To perform this bombarding process it is necessary to have a means for accelerating more than one ion beam at a time, such as the Triple Ion Irradiation Laboratory at Oak Ridge National Laboratory (ORNL) in Oak Ridge, Tenn. To penetrate the surface to a desired depth, the bombarding ion beams are accelerated to a sufficient energy level that can be determined by a person of ordinary skill in the art. A skilled person can also tailor the concentrations of the ions as desired.

Example I

Kapton, Teflon, Tefzel and PET were implanted with various ions using the triple ion accelerator facility at ORNL. The table shows the results, comparing data for UV-crosslinked polymer, a conventional treatment in the industry, and an implanted metallic alloy, Fe-Cr-Ni stainless steel. The superior hardness of certain surfaces is evident from the data.

TABLE

| HARDNESS OF POLYMER AT 100 nm DEPTH | | | | | |
|---|---|---|---|---|---|
| | | | Hardness (GPa) | | Improvement |
| Polymer | Ions | Energy (MeV) | Virgin | Implanted | (times) |
| Kapton | $B^+$ | 0.2 | 0.42 | 3 | 7 |
| | $N^+$ | 0.3 | 0.42 | 5.3 | 13 |
| | N/B | 0.3/0.2 | 0.42 | 5.9 | 14 |
| | B, N | 0.2/0.3 | 0.42 | 5 | 12 |
| | B, C | 0.4/0.6 | 0.42 | 10 | 24 |
| | B, C, N | 0.4/0.6/0.7 | 0.42 | 11 | 26 |

TABLE-continued

| HARDNESS OF POLYMER AT 100 nm DEPTH | | | | | |
|---|---|---|---|---|---|
| | | | Hardness (GPa) | | Improvement |
| Polymer | Ions | Energy (MeV) | Virgin | Implanted | (times) |
| | $Fe^{++}$ | 2 | 0.42 | 7.5 | 18 |
| | He | 0.2 | 0.42 | 1.2 | 2.5 |
| | DLC-Coating | | 0.42 | 0.6 | 1.5 |
| Teflon | $B^+$ | 0.2 | 0.2 | 0.4 | 2 |
| | $N^+$ | 0.3 | 0.2 | 0.1–0.7 | 0.5–3.5 |
| | B, N | 0.2/0.3 | 0.2 | 0.3–0.6 | 1.5–3 |
| | $Fe^{++}$ | 2 | 0.2 | 0.3 | 1.5 |
| Tefzel | $Fe^{++}$ | 1 | 0.15 | 3.1 | 20 |
| PET | $Fe^{++}$ | 1 | 0.42 | 5 | 12 |
| PG 901WC | UV | | | 0.68 | — |
| (Fe—Cr—Ni) | B, C, N | 0.4/0.6/0.7 | 3 | 6.3 | 2 |
| | $W_2C$ | e-beam evap | 3 | 4.5 | 1.5 |

It is clear that the polymers exhibit surface improvement after bombardment and Kapton shows significant surface hardening when subjected to multiple ion bombardment.

Example II

Kapton polyimide film was implanted with 0.4 MeV boron, 0.7 MeV nitrogen, and 0.6 MeV carbon. The implanted surface exhibited substantial improvements in surface smoothness, hardness and wear resistance. Implanted specimens showed over thirty times greater hardness for simultaneous triple beam implantation and over ten times larger hardness for single (boron) and dual (boron, nitrogen) beam implantation compared with unimplanted material as shown in the Figure. Actually, the hardness may be underestimated due to the softness of untreated material lying beyond the ion beam range. Wear properties were characterized after 10,000 reciprocating cycles using a nylon ball or high carbon 52100 steel ball with one Newton normal force. Severe wear tracks were observed in virgin Kapton, but no appreciable wear was observed in ion implanted Kapton.

This invention provides a new class of polymers that have been subjected to multiple ion beam implantation. In addition to the simultaneous bombardment process, the invention provides a sequential implantation process without breaking the vacuum that is present during bombardment. It not only allows direct compound formation among implanted ion species as well as with the host polymer structural components, it also causes new bond formation between existing polymer chains, a form of alloying. Operators can tailor hard particle precipitates such as carbides, nitrides, silicides, oxides, hydrides and other compounds using this technique. The process may find further use by providing for the introduction of solid lubricants such as $MoS_2$, $MoSe_2$, $ZrO_2$, PbO, CdO, BN, $NbSe_2$, SbS, $PbI_2$, $CdI_2$, $BI_2$ and $AgI_2$ to the surface of polymers. These applications are made possible by the synergistic effects of multiple ion beams on polymers in alloying, chemical crosslinking, precipitation and catalytic properties. As an example of catalytic properties, Pt/activated-carbon catalysts have been prepared by a chemical process, the reduction of chloroplatinic acid ($H_2PtCl_6$) by borohydride ($NaBH_4$). ion implantation can provide a means for preparing more versatile and flexible catalysts by choosing various combinations of catalytic agent/medium system, for example, as Fe, Ni, Pt and Pd implanted into various polymer fibers or films.

We claim:

1. A process for hardening the surface of a polymer comprising the steps of:

providing a polymer having a surface; and, bombarding said surface of said polymer by ion implantation with ions of elements that when reacted with the elements of said polymer will form a compound having a hardness greater than the hardness of said polymer, the energy level of said ions being at least about 0.2 MeV, so that said surface of said polymer is hardened.

2. The process of claim 1 wherein said alloying elements are those that are carbide forming.

3. The process of claim 2 wherein said alloying elements are selected from the group consisting of Si, Zr and W.

4. The process of claim 1 wherein said polymers are those that are able to withstand ion beam bombardment without surface softening.

5. The process of claim 4 wherein said polymers are selected from the group consisting of Kapton, Lexan, Teflon, Tefzel, PET and PEEK.

6. The process of claim 1 wherein said bombarding step further comprises the simultaneous ion implantation of at least two different ions.

7. The process of claim 1 wherein said surface of said polymer is made wear resistant.

8. A process for hardening the surface of a polymer comprising the steps of:

providing a polymer having a surface; and, bombarding said surface of said polymer by ion implantation with ions of alloying elements that react together to form a compound having a hardness greater than the hardness of said polymer, the energy level of said ions being at least about 0.2 MeV, so that said surface of said polymer is hardened.

9. The process of claim 8 wherein said alloying elements are carbon and one or more carbide forming elements.

10. The process of claim 8 wherein said alloying elements are silicon and one or more silicide forming elements.

11. The process of claim 8 wherein said alloying elements are nitrogen and one or more nitride forming elements.

12. The process of claim 8 wherein said alloying elements are oxygen and one or more oxide forming elements.

13. The process of claim 8 wherein said polymers are those that are able to withstand ion beam bombardment without surface softening.

14. The process of claim 13 wherein said polymers are selected from the group consisting of Kapton, Lexan, Teflon, Tefzel, PET and PEEK.

15. The process of claim 8 wherein said bombarding step further comprises the simultaneous ion implantation of at least two different ions.

16. The process of claim 8 wherein said surface of said polymer is made wear resistant.

17. A process for hardening the surface of a polymer comprising the steps of:

providing a polymer having a surface; and, bombarding said surface of said polymer by ion implantation with ions of alloying elements that react with the elements of said polymer to effect chemical crosslinking among polymer chains, the energy level of said ions being at least about 0.2 MeV, so that said surface of said polymer is hardened.

18. The process of claim 17 wherein said alloying elements are multivalent elements.

19. The process of claim 17 wherein said alloying elements are selected from the group consisting of C, Fe, B, Cr, V, Ti, Hf and S.

20. The process of claim 17 wherein said polymers are those that are able to withstand ion beam bombardment without surface softening.

21. The process of claim 20 wherein said polymers are selected from the group consisting of Kapton, Lexan, Teflon, Tefzel, PET and PEEK.

22. The process of claim 17 wherein said bombarding step further comprises the simultaneous ion implantation of at least two different ions.

23. The process of claim 17 wherein said surface of said polymer is made wear resistant.

* * * * *